US012767517B2

(12) United States Patent
Yoo et al.

(10) Patent No.: US 12,767,517 B2
(45) Date of Patent: Oct. 20, 2026

(54) MEMS MICROPHONE AND METHOD FOR FABRICATING THE SAME

(71) Applicants: HYUNDAI MOTOR COMPANY, Seoul (KR); Kia Corporation, Seoul (KR)

(72) Inventors: Ilseon Yoo, Hwaseong-si (KR); Sang-Hyeok Yang, Suwon-si (KR); Dong Gu Kim, Suwon-si (KR); Hyunsoo Kim, Yongin-si (KR)

(73) Assignees: HYUNDAI MOTOR COMPANY, Seoul (KR); Kia Corporation, Seoul (KR)

( * ) Notice: Subject to any disclaimer, the term of this patent is extended or adjusted under 35 U.S.C. 154(b) by 1133 days.

(21) Appl. No.: 17/865,289

(22) Filed: Jul. 14, 2022

(65) Prior Publication Data

US 2023/0032424 A1 Feb. 2, 2023

(30) Foreign Application Priority Data

Jul. 26, 2021 (KR) ........................ 10-2021-0098132

(51) Int. Cl.
*B81B 3/00* (2006.01)

(52) U.S. Cl.
CPC .... *B81B 3/0021* (2013.01); *B81B 2201/0257* (2013.01); *B81B 2203/0127* (2013.01); *B81B 2203/0353* (2013.01); *B81B 2203/04* (2013.01)

(58) Field of Classification Search
CPC ...... H04R 2201/003; H04R 7/04; H04R 7/18; H04R 19/04; B81B 2203/0127; B81B 2203/0353
See application file for complete search history.

(56) References Cited

U.S. PATENT DOCUMENTS

| | | | | |
|---|---|---|---|---|
| 2007/0121972 | A1* | 5/2007 | Suzuki ................. | H04R 19/005 381/174 |
| 2018/0146299 | A1 | 5/2018 | Yoo | |
| 2021/0204048 | A1* | 7/2021 | Chandrasekaran ...... | H04R 1/04 |
| 2021/0392438 | A1* | 12/2021 | Stojanovic ............... | H04R 7/14 |

FOREIGN PATENT DOCUMENTS

| | | | |
|---|---|---|---|
| KR | 10-1849851 | B1 | 4/2018 |
| KR | 10-2018-0058515 | A | 6/2018 |
| KR | 10-2018-0067400 | A | 6/2018 |

OTHER PUBLICATIONS

Office Action issued in corresponding Korean Patent Application No. 10-2021-0098132 dated Jun. 13, 2025.

* cited by examiner

*Primary Examiner* — Sunita Joshi
(74) *Attorney, Agent, or Firm* — MORGAN, LEWIS & BOCKIUS LLP

(57) ABSTRACT

A MEMS microphone according to an embodiment comprises a substrate including an air chamber in a central portion, a back-plate disposed above the substrate and including a plurality of penetration holes through which a sound wave passes, and a vibration membrane disposed between the back-plate and the substrate, forming compressive residual stress, having a base form convexly bent toward the back-plate, and configured to vibrate a sound pressure transferred through the plurality of penetration holes.

7 Claims, 15 Drawing Sheets

MEMS MICROPHONE AND METHOD FOR FABRICATING THE SAME

CROSS-REFERENCE TO RELATED APPLICATION

The present application claims the benefit of priority to Korean Patent Application No. 10-2021-0098132, filed on Jul. 26, 2021 in the Korean Intellectual Property Office, the entire contents of which are incorporated herein by reference.

TECHNICAL FIELD

The present disclosure relates to a MEMS microphone and a method for fabricating the same.

BACKGROUND

Typically, a micro-electromechanical systems (MEMS) microphone includes a vibration membrane and a back-plate. When a sound pressure is applied to the vibration membrane, the vibration membrane moves up and down, and at this time, a change of capacitance between the vibration membrane and the back-plate is converted into a voltage signal.

Important factors that determine the sensitivity of a MEMS microphone include the rigidity of the vibration membrane, the spacing between the vibration membrane and the back-plate, the bias voltage, and the like. In order to improve the sensitivity, research has been conducted on techniques to, in the procedural aspect, lower the residual stress of the vibration membrane or reduce the spacing between the vibration membrane and the back-plate, or in the structural aspect, decrease the rigidity while relieving the residual stress of the vibration membrane.

For example, by lowering the rigidity of the vibration membrane, the sensitivity of the MEMS microphone may be improved. However, these attempts are reaching a limit, and the improvement in sensitivity through this is only marginal. In addition, there are studies to improve sensitivity by increasing the number of thin films, but there is a problem of process difficulty and cost increase. On the other hand, research to reduce the gap between the vibration membrane and the back-plate is continuously being conducted, but there is a difficulty in securing yield and reproducibility due to the high difficulty in the process.

The above information disclosed in this Background section is only for enhancement of understanding of the background of the present disclosure, and therefore it may contain information that does not form the prior art that is already known in this country to a person of ordinary skill in the art.

SUMMARY

The present disclosure provides a MEMS microphone having improved sensitivity and a method for fabricating the same.

A MEMS microphone according to an exemplary embodiment of the present disclosure may include a substrate having an air chamber in a central portion, a back-plate disposed above the substrate, and having a plurality of penetration holes through which a sound wave passes, and a vibration membrane disposed between the back-plate and the substrate, forming compressive residual stress, having a base form convexly bent toward the back-plate, and configured to vibrate a sound pressure transferred through the plurality of penetration holes.

The back-plate may include a back-plate electrode layer disposed on a surface facing the vibration membrane, and the vibration membrane may be configured to be conductive, such that a sound pressure signal is converted into an electric signal according to a change in a capacitance between the back-plate electrode layer and the vibration membrane.

The vibration membrane may include a corrugation portion disposed within a range of the air chamber, and a bent portion located radially inside the corrugation portion, and located closer to the back-plate in comparison with a part of the vibration membrane radially outside the corrugation portion.

The corrugation portion may have a circular or polygonal shape having a predetermined size centered at a center of the air chamber.

A distance between the back-plate and the bent portion of the vibration membrane may be smallest at a center of the bent portion, and may become larger as it is farther from the center of the bent portion.

The vibration membrane may be configured to support the bent portion toward the back-plate by the compressive residual stress of the vibration membrane.

The bent portion may be bent toward the back-plate electrode layer by applying a preset bending voltage between the back-plate electrode layer and the vibration membrane.

A back-plate electrode pad may be disposed in the back-plate electrode layer and a vibration membrane electrode pad may be disposed in the vibration membrane, in order to detect the capacitance between the back-plate electrode layer and the vibration membrane. The bent portion may be bent toward the back-plate by applying the preset bending voltage between the back-plate electrode pad and the vibration membrane electrode pad.

A first metal layer may be disposed on the back-plate electrode pad as an electrode terminal, and a second metal layer may be disposed on the vibration membrane electrode pad as an electrode terminal.

A method for fabricating a MEMS microphone according to an exemplary embodiment includes depositing and patterning an oxide layer on a substrate, forming a vibration membrane in which compressive residual stress remains by depositing, ion-implanting, and annealing a vibration membrane material on the patterned oxide layer, depositing a sacrificial layer on the vibration membrane, forming a back-plate electrode layer by depositing, ion-implanting, and annealing a back-plate electrode material on the sacrificial layer, depositing a back-plate supporting layer on the sacrificial layer to cover the back-plate electrode layer, forming a plurality of penetration holes through which a sound wave passes in the back-plate by patterning the back-plate supporting layer and the back-plate electrode layer, opening a back-plate electrode pad of the back-plate electrode layer and a vibration membrane electrode pad of the vibration membrane, by patterning the back-plate supporting layer and the sacrificial layer, depositing and patterning a metal layer on the back-plate electrode pad of the back-plate electrode layer and the vibration membrane electrode pad of the vibration membrane, forming an air chamber within the substrate by etching the substrate, enabling the vibration membrane to sag downward by the compressive residual stress, by etching the sacrificial layer above the air chamber, converting the vibration membrane sagging downward to be bent toward the back-plate, by applying a preset bending voltage between the back-plate electrode pad and the vibration membrane electrode pad, applying a set bending voltage between the fixed membrane electrode pad and the vibrating membrane electrode pad to bend the drooping vibrating membrane toward the fixed membrane, releasing the preset bending voltage when bending of the vibration membrane toward the back-plate.

In the depositing and patterning the oxide layer, a corrugation pattern may be formed by patterning the oxide layer.

The forming the vibration membrane, a corrugation portion may be formed in the vibration membrane by forming the vibration membrane on the oxide layer formed with the corrugation pattern.

After the releasing the bending voltage, a bent portion may be supported toward the back-plate by the compressive residual stress of the vibration membrane.

According to an exemplary embodiment, the base form of the vibration membrane may be positioned closer to back-plate, the sensitivity of the MEMS microphone may be improved.

Such a MEMS microphone may be fabricated by applying a voltage between the back-plate electrode terminal and the vibration membrane electrode terminal during the fabricating process, and therefore, a MEMS microphone having high-sensitivity may be fabricated by a process that is not excessively complex in comparison with the existing process.

Other effects that may be obtained or are predicted by an embodiment will be explicitly or implicitly described in a detailed description of the present disclosure. That is, various effects that are predicted according to an exemplary embodiment will be described in the following detailed description.

DETAILED DESCRIPTION OF THE EMBODIMENTS

Figure 1:
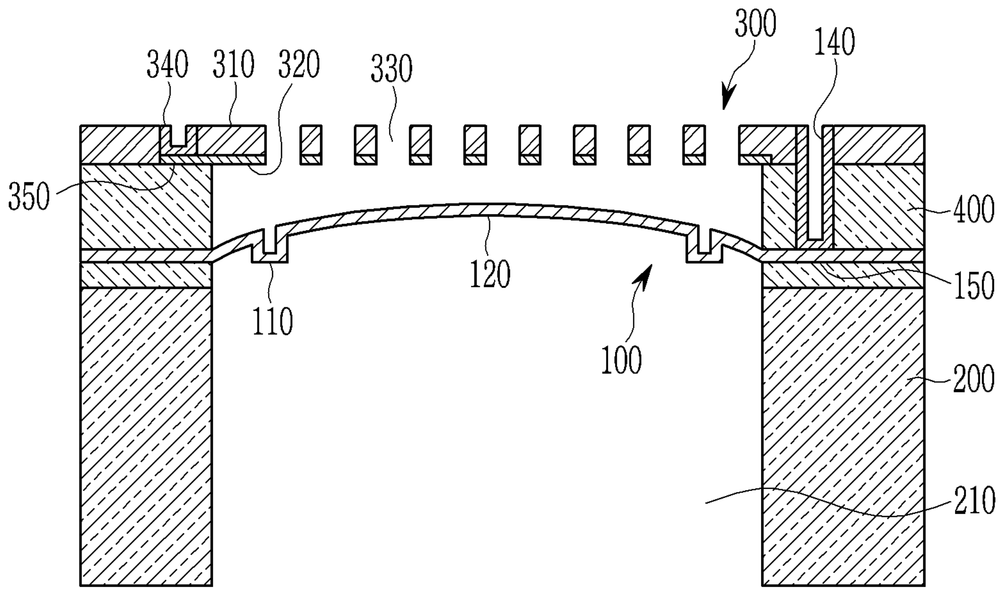
FIG. 1 is a schematic diagram of a MEMS microphone according to an exemplary embodiment.

Hereinafter, exemplary embodiments disclosed in the present specification will be described in detail with reference to the accompanying drawings. In the present specification, the same or similar components will be denoted by the same or similar reference numerals, and a repeated description thereof will be omitted.

In describing exemplary embodiments of the present specification, when it is determined that a detailed description of the well-known art associated with the present disclosure may obscure the gist of the present disclosure, it will be omitted. The accompanying drawings are provided only in order to allow exemplary embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to the other component or may be connected or coupled to the other component with a further component intervening therebetween. Further, it is to be understood that when one component is referred to as being "directly connected" or "directly coupled" to another component, it may be connected or coupled directly to the other component without a further component intervening therebetween.

It will be further understood that terms "comprise" and "have" used in the present specification specify the presence of stated features, numerals, steps, operations, components, parts, or combinations thereof, but do not preclude the presence or addition of one or more other features, numerals, steps, operations, components, parts, or combinations thereof.

Terms "unit", "part" or "portion", "-er", and "module" for components used in the following description are used only in order to easily describe the specification. Therefore, these terms do not have meanings or roles that distinguish them from each other in and of themselves. In addition, the terms "unit", "part" or "portion", "-er", and "module" in the specification refer to a unit that processes at least one function or operation, which may be implemented by hardware, software, or a combination of hardware and software.

As used herein, the singular forms are intended to include the plural forms as well, unless the context clearly indicates otherwise. As used herein, the term "and/or" includes any one or all combinations of one or more related items.

An exemplary embodiment is hereinafter described in detail with reference to the drawings.

FIG. 1 is a schematic diagram of a MEMS microphone according to an exemplary embodiment.

Figure 2:
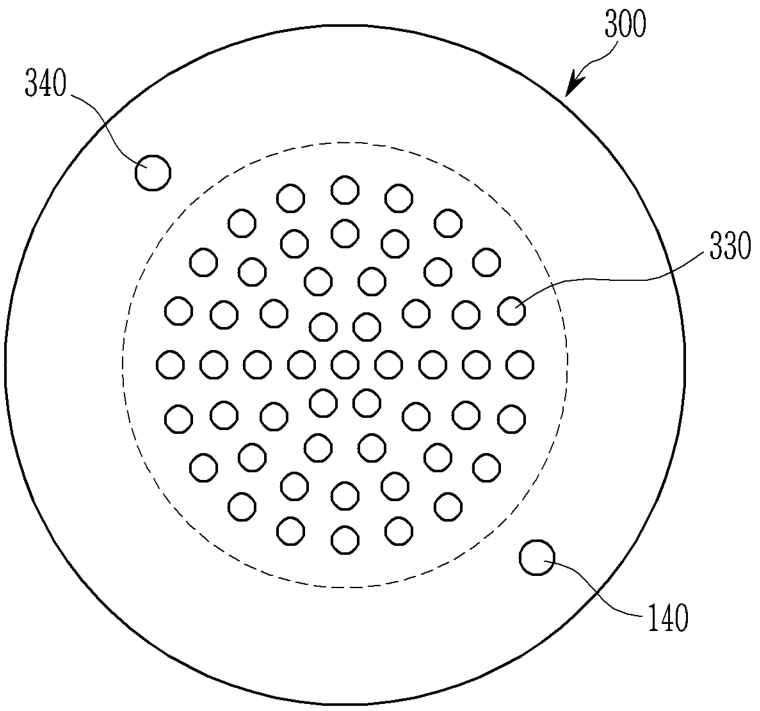
FIG. 2 is a top plan view showing an exemplary back-plate of a MEMS microphone according to an exemplary embodiment.

FIG. 2 is a top plan view showing an exemplary back-plate of a MEMS microphone according to an exemplary embodiment.

Figure 3A:
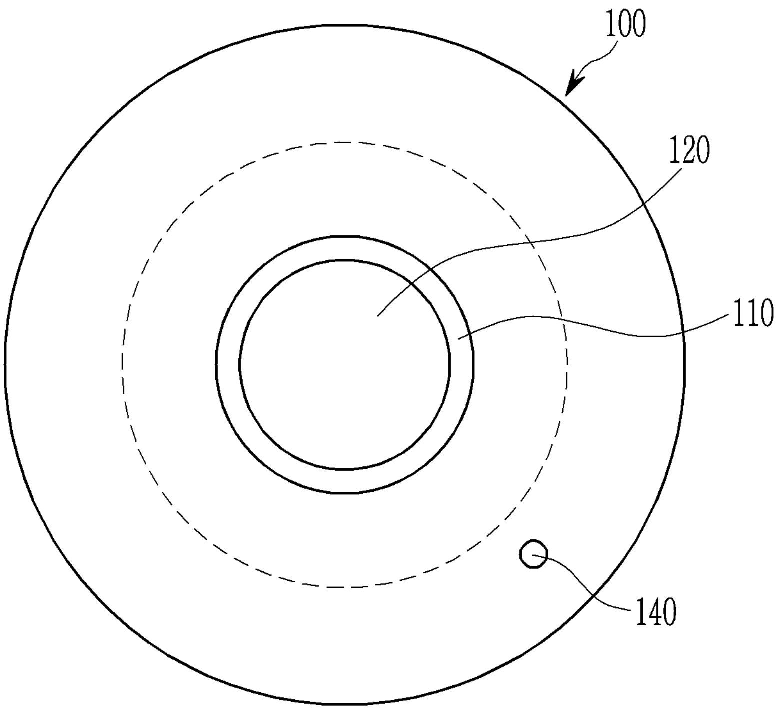
FIG. 3A and FIG. 3B are top plan views of exemplary vibration membranes of a MEMS microphone according to an exemplary embodiment.
Figure 3B:
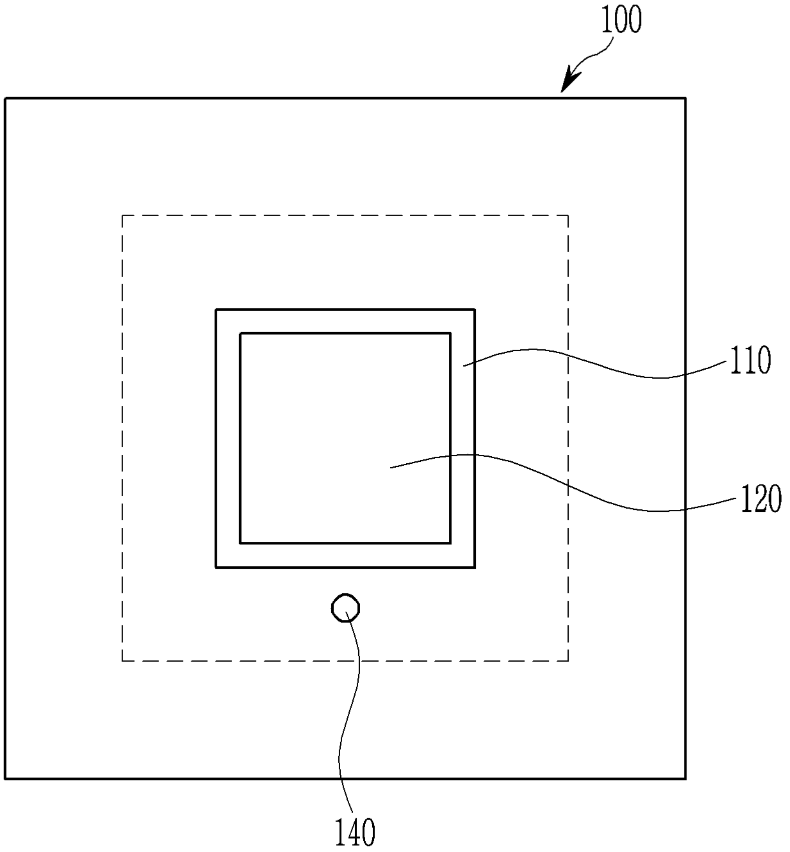

FIG. 3A and FIG. 3B are top plan views of exemplary vibration membranes of a MEMS microphone according to an exemplary embodiment.

As shown in FIG. 1, a MEMS microphone according to an exemplary embodiment includes a substrate 200, a back-plate 300, and a vibration membrane 100.

The substrate 200 may be, for example, a silicon substrate. The substrate 200 forms an air chamber 210 in a central portion.

The back-plate 300 is disposed above the substrate 200, and forms a plurality of penetration holes 330 through which a sound wave passes.

FIG. 2 illustrates the back-plate 300 of a MEMS microphone according to an exemplary embodiment to be circular, however, it may be understood that this is a mere example for explanation, and the present exemplary embodiment is not limited to a specific shape. For example, a MEMS microphone according to an exemplary embodiment may be formed in the form of polygons such as a quadrangle, and accordingly the back-plate 300 may also be formed in the form of polygons such as a quadrangle.

The vibration membrane 100 is disposed between the back-plate 300 and the substrate 200, forms compressive residual stress, has a base form that is convexly bent toward the back-plate 300, and vibrates a sound pressure transferred through the plurality of penetration holes 330.

For example, according to deposition conditions when depositing the vibration membrane 100, the compressive residual stress may remain in the vibration membrane 100, which may be implemented by a method known to a person skilled in the art, and the present exemplary embodiment is not limited to such specific deposition methods.

Here, the base form of the vibration membrane 100 means the form at a free state, in which no sound pressure is applied to the vibration membrane 100 and no voltage is applied between the back-plate 300 and the vibration membrane 100. That is, even if the vibration membrane 100 is originally formed flat, the vibration membrane 100 may be bent while vibrating according to the sound pressure, and such a bent state during the operation of the vibration membrane 100 should not be interpreted as the base form of the vibration membrane 100. In addition, the vibration membrane 100 may be bent by applying a base voltage, for example, in order to detect the vibration of the sound pressure applied to the vibration membrane 100, but such a bent state should not be interpreted as the base form of the vibration membrane 100.

The back-plate 300 includes a back-plate electrode layer 320 disposed on a surface facing the vibration membrane 100. The back-plate electrode layer 320 is supported by a back-plate supporting layer 310 so as to prevent vertical movement. For example, the back-plate electrode layer 320 may include a polysilicon material, and the back-plate supporting layer 310 may include silicon nitride (SiN).

The vibration membrane 100 may be conductive. Accordingly, the MEMS microphone of the present disclosure converts the sound pressure signal into an electric signal according to a change in a capacitance between the back-plate electrode layer 320 and the vibration membrane 100. That is, the MEMS microphone of the present disclosure is formed as a so-called capacitive MEMS microphone.

In comparison with an existing technique where a vibration membrane and a back-plate extend in parallel with each other, the vibration membrane 100 is disposed close to the back-plate 300 in a MEMS microphone according to an exemplary embodiment, and therefore the sensitivity of the capacitive MEMS microphone may be improved.

As shown in FIG. 1, the vibration membrane 100 includes a corrugation portion 110 and a bent portion 120.

The corrugation portion 110 may be disposed within a range of the air chamber 210. The bent portion 120 is located radially inside the corrugation portion 110, and located closer to the back-plate 300 in comparison with a part of the vibration membrane 100 radially outside the corrugation portion 110. The process of forming the corrugation portion 110 and the bent portion 120 to be such will be later described in detail, in connection with a method for fabricating a MEMS microphone according to an exemplary embodiment.

By dividing the vibration membrane 100 into the corrugation portion 110 and the bent portion 120 as described above, the vibration membrane 100 may be rapidly bent, in the corrugation portion 110, toward the back-plate 300. Therefore, the bent portion 120 inside the corrugation portion 110 may be positioned closer to the back-plate 300 with a larger area and less curvature. It is easy to understand that this will help further improve the sensitivity of the MEMS microphone. It is easily understood that this will help to further improve the sensitivity of the MEMS microphone.

In addition, by forming the vibration membrane 100 divided into the corrugation portion 110 and the bent portion 120, it is easy to understand that, when the vibration membrane 100 vibrates by the sound pressure, the vertical motion of the bent portion 120 may be more freely by the corrugation portion 110, and this helps to improve the sensitivity of the MEMS microphone.

Although the drawing illustrates only one wrinkle formed in the corrugation portion 110, the present exemplary embodiment is not limited thereto. It is easy to understand that a person skilled in the art may form as many number of wrinkles in the corrugation portion 110 as required.

FIG. 3A illustrates that the vibration membrane 100 of a MEMS microphone according to an exemplary embodiment to be circular, however, it may be understood that this is a mere example for explanation, and the present exemplary embodiment is not limited to a specific shape. For example, as shown in FIG. 3B, a MEMS microphone according to an exemplary embodiment may be formed in the form of polygons such as quadrangles, and accordingly, the vibration membrane 100 may also be formed in the form of polygons such as quadrangles.

As a possible implementation, as shown in FIG. 3A, the corrugation portion 110 may be formed in a circular shape having a predetermined size centered at a center of the air chamber 210. As another possible implementation, as shown in FIG. 3B, the corrugation portion 110 may be formed in a polygonal (e.g., quadrangular) shape having a predetermined size centered at a center of the air chamber 210. It may be understood that, in the present exemplary embodiment, the corrugation portion 110 is not limited to a specific form.

In addition, the overall form of the MEMS microphone and the specific form of the corrugation portion 110 may be generally the same (e.g., circular, polygonal, and the like), however, the present exemplary embodiment is not limited thereto. For example, it may be understood that it is possible that the MEMS microphone is formed quadrangularly, and the corrugation portion 110 may be formed circularly.

As such, since the bent portion 120 is formed, a distance between the back-plate 300 and the bent portion 120 of the vibration membrane 100 is smallest at a center of the bent portion 120, and becomes larger as it is farther from the center of the bent portion 120.

In a base state, the vibration membrane 100 supports the bent portion 120 toward the back-plate 300 by the compressive residual stress of the vibration membrane 100. That is, the compressive residual stress supports the vibration membrane 100 to cancel out the gravitational force applied to the vibration membrane 100 to sag downward, and thereby the overall convex form toward the back-plate 300 becomes an equilibrium state.

Figure 4A:
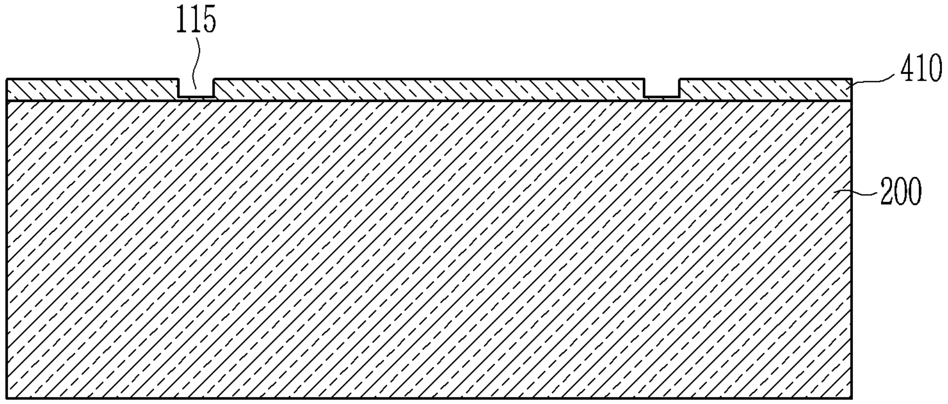
FIGS. 4A, 4B, 4C, 4D, 4E, 4F, 4G, 4H, 4I, 4J and 4K form a process flowchart showing a method for fabricating a MEMS microphone according to an exemplary embodiment.
Figure 4B:
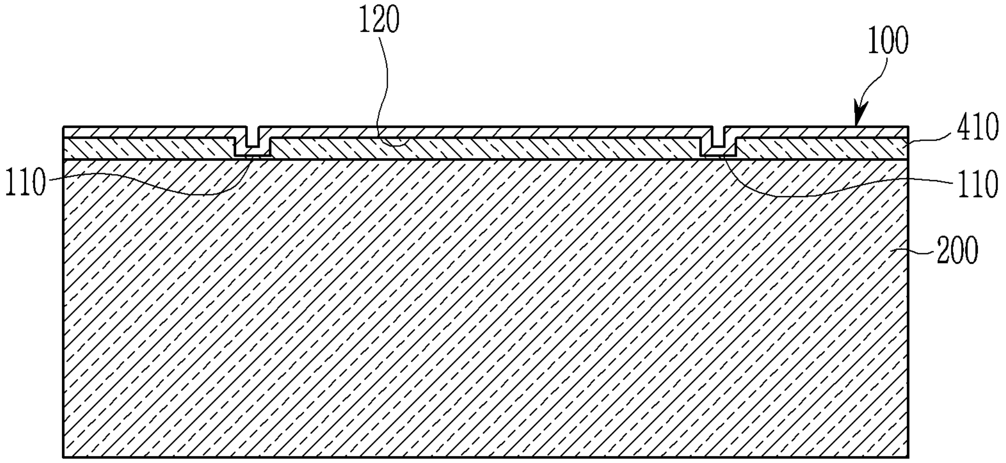
Figure 4C:
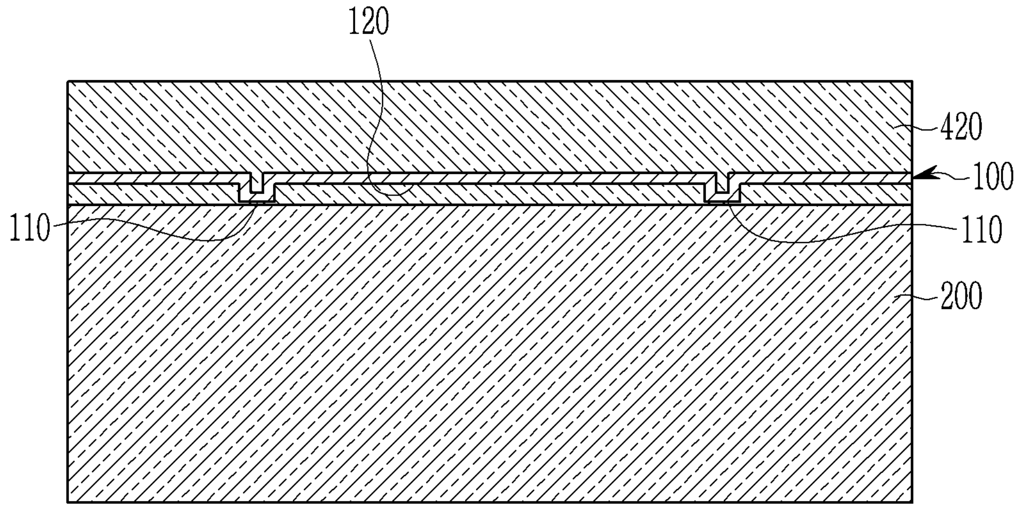
Figure 4D:
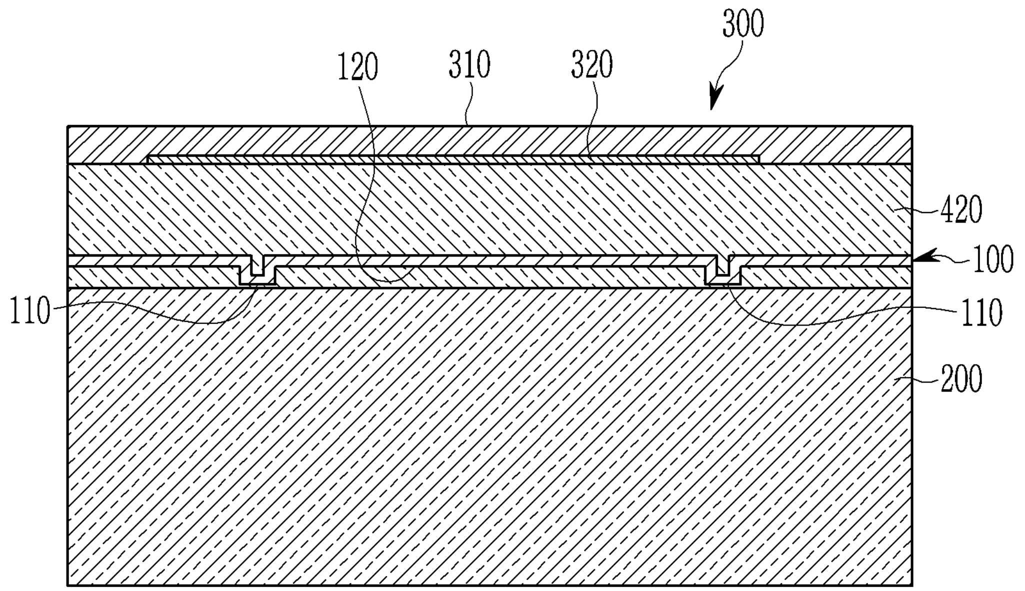
Figure 4E:
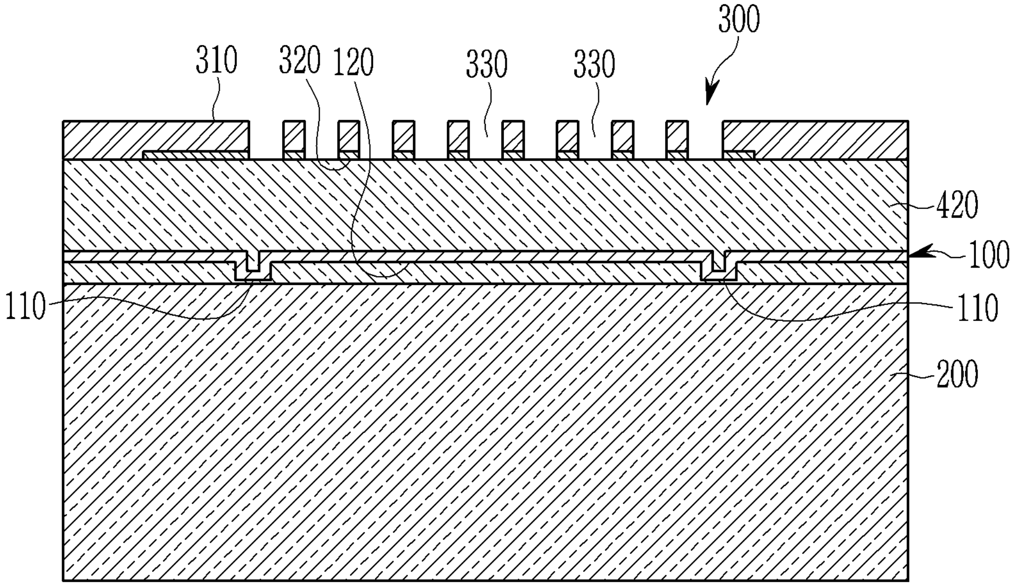
Figure 4F:
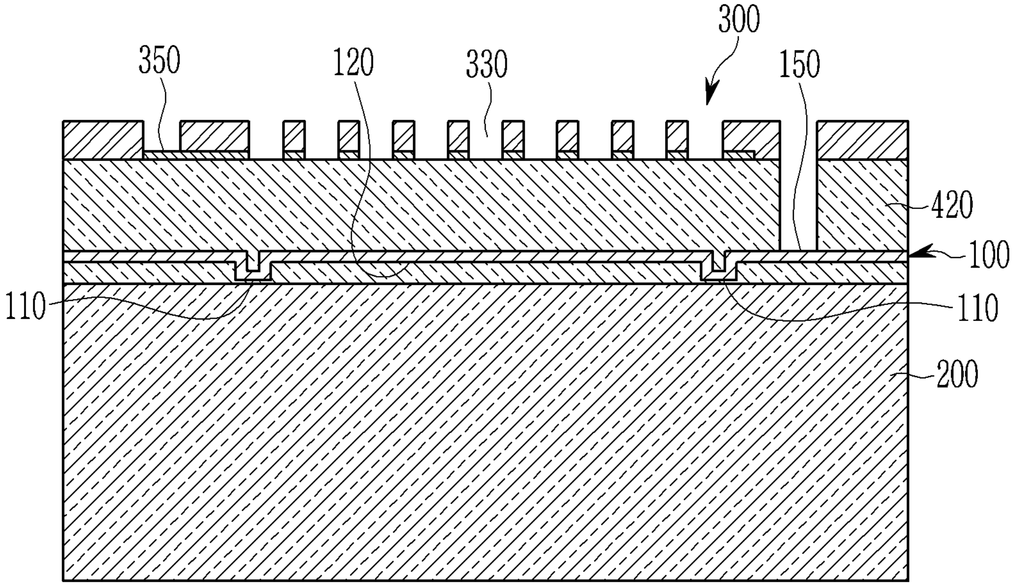
Figure 4G:
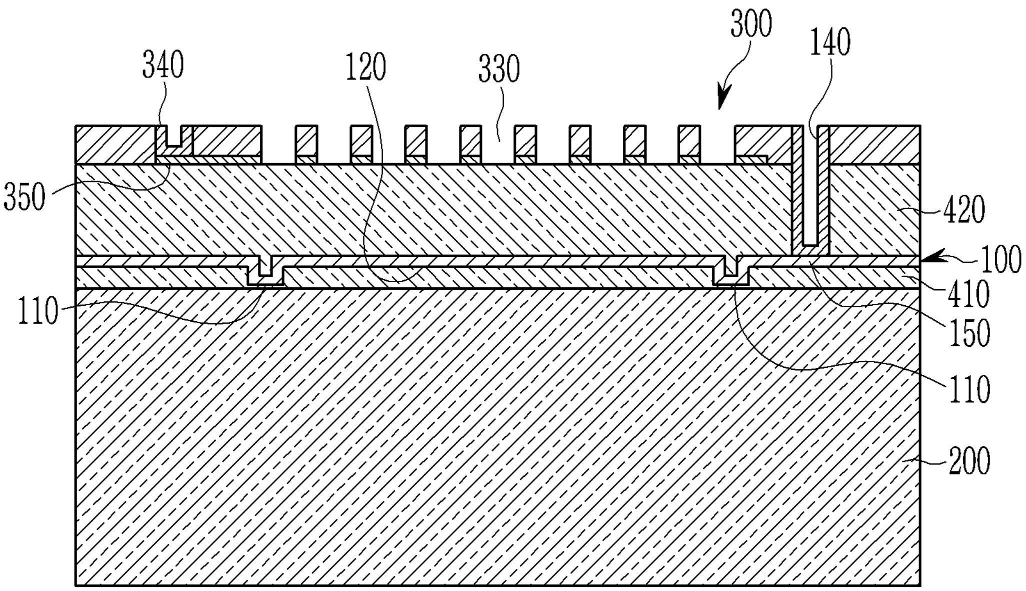
Figure 4H:
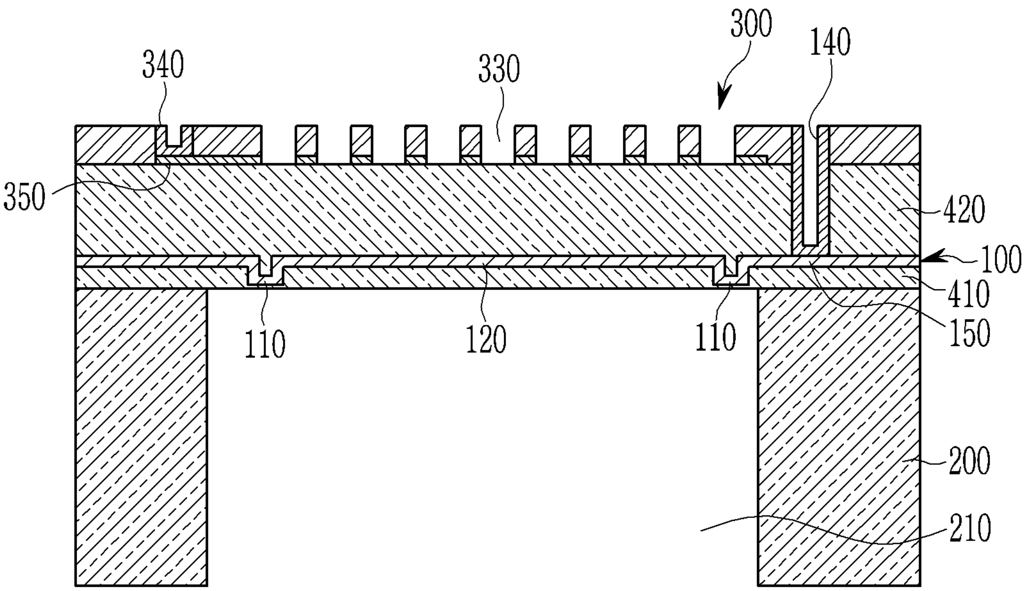
Figure 4I:
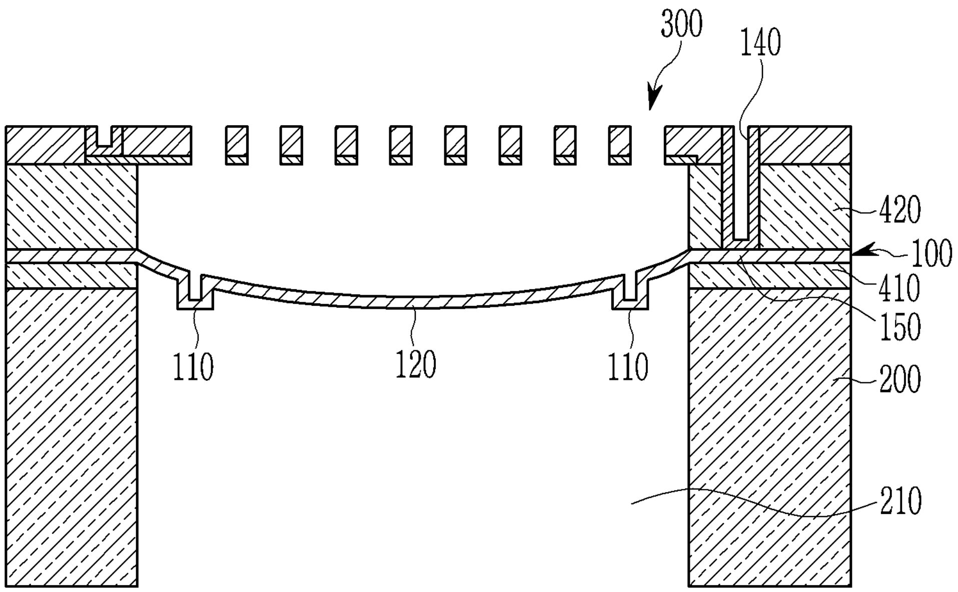
Figure 4J:
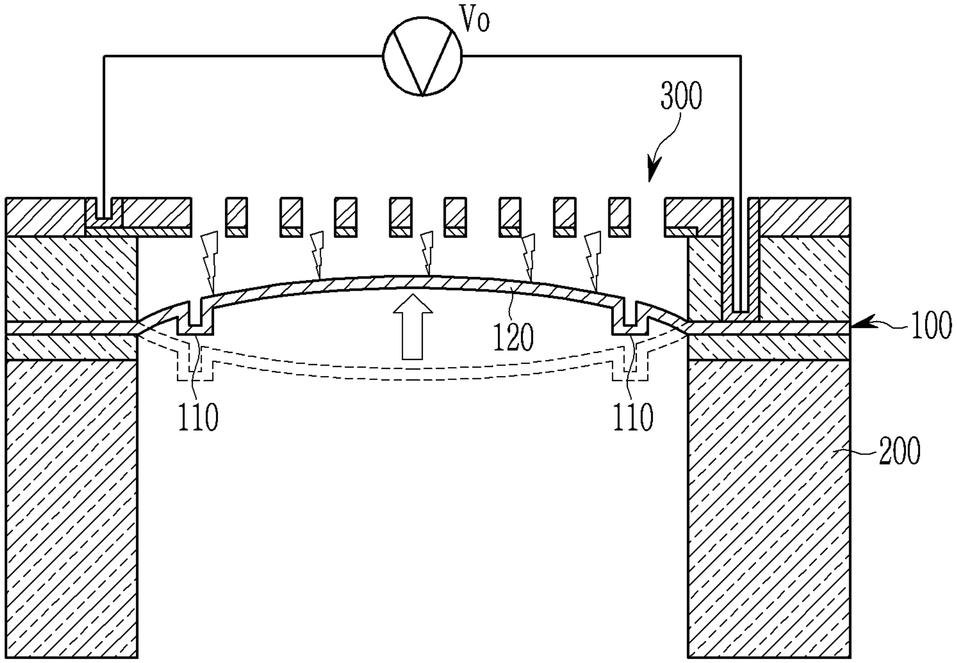

The bent portion 120 is bent toward the back-plate electrode layer 320 by applying a preset bending voltage V0 between the back-plate electrode layer 320 and the vibration membrane 100 (refer to FIG. 4J).

A back-plate electrode pad 350 is disposed in the back-plate electrode layer 320 and a vibration membrane electrode pad 150 is disposed in the vibration membrane 100, in order to detect the capacitance between the back-plate electrode layer 320 and the vibration membrane 100. A metal layer 340 for forming an electrode terminal is disposed on the back-plate electrode pad 350, and a metal layer 140 for forming an electrode terminal is disposed on the vibration membrane electrode pad 150.

The bent portion 120 is bent toward the back-plate 300 by applying the bending voltage V0 between the back-plate electrode pad 350 and the vibration membrane electrode pad 150.

The configuration of the MEMS microphone of an exemplary embodiment may be more clearly understood from a method for fabricating the MEMS microphone of an exemplary embodiment that is hereinafter described.

Hereinafter, a method for fabricating the MEMS microphone of an exemplary embodiment is described in detail with reference to FIG. 4A to FIG. 4K. It may be understood that, in the following description, matters already known in the field of semiconductor process will be briefly mentioned, and details unique to a method for fabricating the MEMS microphone of an exemplary embodiment will be described in more detail.

As shown in FIG. 4A, first, an oxide layer 410 is deposited on the substrate 200 and then patterned. For example, during the process of patterning the oxide layer 410, a corrugation pattern 115 corresponding to the corrugation portion 110 of the vibration membrane 100 may be formed.

Subsequently, as shown in FIG. 4B, the vibration membrane 100 in which the compressive residual stress remains is formed by depositing, ion-implanting, and annealing a vibration membrane material on the patterned oxide layer 410.

For example, the vibration membrane material may be polysilicon. The ion-implanting process is a process to implant ions having conductivity, and the vibration membrane 100 may have electrical conductivity by the process.

As described above, according to deposition conditions when depositing the vibration membrane 100, the compressive residual stress may remain in the vibration membrane 100.

In such a vibration membrane forming process, the vibration membrane 100 may be disposed on the oxide layer 410 formed with the corrugation pattern 115. In addition, it may be understood that the corrugation portion 110 corresponding to the corrugation pattern 115 may be disposed in the vibration membrane 100. The portion of the vibration membrane 100 radially inside the corrugation portion 110 is referred to the bent portion 120, as described above. Subsequently, as shown in FIG. 4C, a sacrificial layer 420 is deposited on the vibration membrane 100. The sacrificial layer 420 may be formed as, for example, an oxide layer.

Subsequently, as shown in FIG. 4D, the back-plate electrode layer 320 is formed by depositing, ion-implanting, and annealing a back-plate electrode material on the sacrificial layer 420. In addition, the back-plate supporting layer 310 is deposited on the sacrificial layer 420 to cover the back-plate electrode layer 320.

It may be understood that capacitance is formed between the back-plate electrode layer 320 and the vibration membrane 100, and the change in the capacitance according to the vibration of the vibration membrane 100 is used to detect the sound pressure. The back-plate electrode material forming the back-plate electrode layer 320 may be, for example, polysilicon.

The back-plate supporting layer 310 supports the back-plate electrode layer 320 so as not to vertically move. A back-plate supporting layer material forming the back-plate supporting layer 310 may be silicon nitride (SiN).

Subsequently, as shown in FIG. 4E, by patterning the back-plate supporting layer 310 and the back-plate electrode layer 320, the plurality of penetration holes 330 through which the sound wave passes are included in the back-plate 300.

Subsequently, as shown in FIG. 4F, by patterning the back-plate supporting layer 310 and the sacrificial layer 420, the back-plate electrode pad 350 and the vibration membrane electrode pad 150 of the vibration membrane 100 are opened.

Subsequently, as shown in FIG. 4G, the metal layers 340 and 140 are deposited and patterned on the back-plate electrode pad 350 and the vibration membrane electrode pad 150 of the vibration membrane 100, respectively.

The metal layers 340 and 140 are for forming terminals to the back-plate electrode pad 350 and the vibration membrane electrode pad 150 of the vibration membrane 100, and may be deposited with any material having excellent electrical conductivity.

Subsequently, as shown in FIG. 4H, the air chamber 210 is formed within the silicon substrate 200 by etching the silicon substrate 200.

Subsequently, as shown in FIG. 4I, the sacrificial layer 420 above the air chamber 210 is etched.

As the sacrificial layer 420 above the air chamber 210 is removed, the vibration membrane 100 sags downward, by the weight of the vibration membrane 100, and by the compressive residual stress of the vibration membrane 100. In addition, by the corrugation portion 110 disposed in the vibration membrane 100, the vibration membrane 100 may sag downward more easily.

The present exemplary embodiment is in contrast with the existing techniques that attempt to use low-stress vibration membrane in order to reduce deformation (i.e., sagging downward) of the vibration membrane 100, that is, in order to maintain the vibration membrane 100 as flat as possible after removing the sacrificial layer 420. In contrast with the existing techniques, in the present exemplary embodiment, in order to strengthen the vending of the vibration membrane, the vibration membrane 100 is deposited such that the compressive residual stress remains, and in addition, the corrugation portion 110 is disposed in the vibration membrane 100. It may be easily understood that, due to the corrugation portion 110 of the vibration membrane 100, the bent portion 120 of the vibration membrane 100 may sag downward more easily.

Subsequently, as shown in FIG. 4J, the preset bending voltage V0 is applied between the back-plate electrode pad 350 and the vibration membrane electrode pad 150.

When the bending voltage V0 is applied, an electrostatic force is formed between the back-plate electrode layer 320 and the vibration membrane 100, which acts as a force to pull the vibration membrane 100 upward. Therefore, the vibration membrane 100 is converted, from the equilibrium state sagging downward immediately after removing the sacrificial layer 420, to the equilibrium state bent convexly upward toward the back-plate 300.

The equilibrium state bent convexly upward forms the base state of the vibration membrane 100. As described above, in the base state of the vibration membrane 100, the vibration membrane 100 supports the bent portion 120 toward the back-plate 300 by the compressive residual stress of the vibration membrane 100. That is, the compressive residual stress supports the vibration membrane 100 to cancel out the gravitational force applied to the vibration membrane 100 to sag downward, and thereby the overall convex form toward the back-plate 300 becomes an equilibrium state.

The preset bending voltage V0 may be applied, for example, in several bolts to several decades of bolts. However, it may be understood that this is a mere example, and the present exemplary embodiment is not limited to a specific size. An appropriate level of the bending voltage V0 may be easily determined by a person skilled in the art, for example, according to dimensions such as a thickness and an area of the vibration membrane 100, the strength of the compressive residual stress remaining in the vibration membrane 100, and the like.

When the bending voltage V0 is applied, the vibration membrane 100 is converted almost instantaneously, from the equilibrium state sagging downward immediately after removing the sacrificial layer 420, to the equilibrium state bent convexly upward toward the back-plate 300. Therefore, the duration during which the bending voltage V0 is apply is not specifically limited in the present exemplary embodiment.

However, depending on implementations, a person skilled in the art may set the duration of applying the bending voltage V0, for example, in consideration of desired design conditions, in order to ensure the conversion (in other words, transition) of the equilibrium state of the vibration membrane 100, in order to provide time to stabilize the equilibrium state bent convexly upward toward the back-plate 300, and/or for other procedural purposes.

Figure 4K:
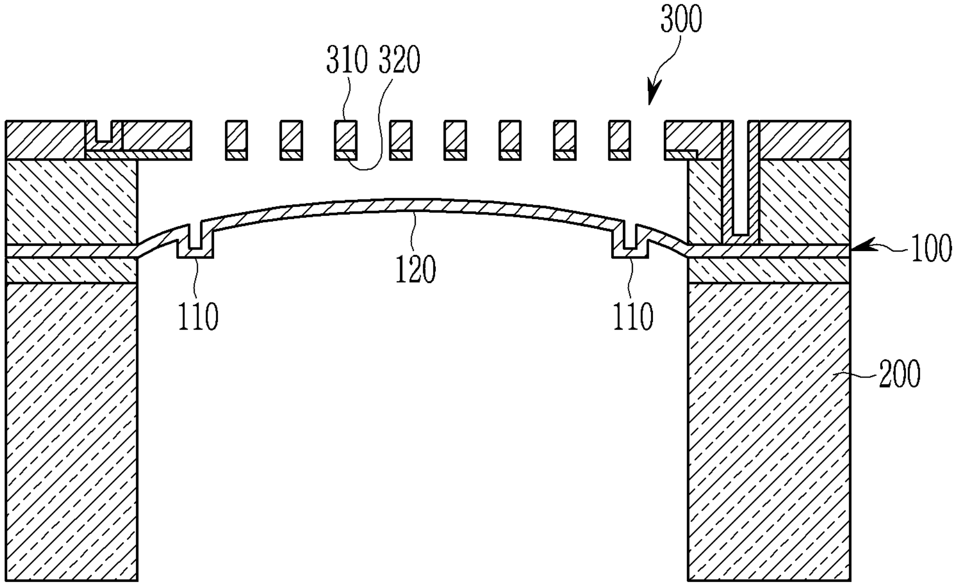

Subsequently, as shown in FIG. 4K, when the bending of the vibration membrane 100 toward the back-plate 300 is finished, the bending voltage V0 is released.

After releasing the bending voltage V0, the bent portion 120 of the vibration membrane 100 is supported toward the back-plate by the compressive residual stress of the vibration membrane, and the vibration membrane 100 may maintain the base form that is convexly bent toward the back-plate 300, as described above.

While this present disclosure has been described in connection with what is presently considered to be practical exemplary embodiments, it is to be understood that the present disclosure is not limited to the disclosed embodiments. On the contrary, it is intended to cover various modifications and equivalent arrangements included within the spirit and scope of the appended claims.

<Description of symbols>

| | |
|---|---|
| 100: vibration membrane | 110: corrugation portion |
| 120: bent portion | 140: metal layer |
| 150: vibration membrane electrode pad | |
| 200: substrate | 210: air chamber |
| 300: back-plate | 310: back-plate supporting layer |
| 320: back-plate electrode layer | 330: penetration hole |
| 340: metal layer | 350: back-plate electrode pad |
| 410: oxide layer | 420: sacrificial layer |
| 115: corrugation pattern | |

What is claimed is:

1. A MEMS microphone, comprising:

a substrate including an air chamber in a central portion;

a back-plate disposed above the substrate and including a plurality of penetration holes through which a sound wave passes; and a vibration membrane disposed between the back-plate and the substrate, forming compressive residual stress, having a base form convexly bent toward the back-plate, and configured to vibrate a sound pressure transferred through the plurality of penetration holes, wherein the vibration membrane comprises:

a corrugation portion disposed within a range of the air chamber; and a bent portion located radially inside the corrugation portion, and located closer to the back-plate in comparison with a part of the vibration membrane radially outside the corrugation portion, wherein the base form of the vibration membrane means a form of the vibration membrane at a free state, in which no sound pressure is applied to the vibration membrane and no voltage is applied between the back-plate and the vibration membrane, wherein, in the base form of the vibration membrane, the vibration membrane is configured to support the bent portion toward the back-plate by the compressive residual stress of the vibration membrane.

2. The MEMS microphone of claim 1, wherein:

the back-plate comprises a back-plate electrode layer disposed on a surface facing the vibration membrane, the vibration membrane is configured to be conductive, and a sound pressure signal is converted into an electric signal according to a change in a capacitance between the back-plate electrode layer and the vibration membrane.

3. The MEMS microphone of claim 2, wherein the corrugation portion has a circular or polygonal shape having a predetermined size centered at a center of the air chamber.

4. The MEMS microphone of claim 2, wherein a distance between the back-plate and the bent portion of the vibration membrane is smallest at a center of the bent portion, and the farther from the center of the bent portion, the larger the distance.

5. The MEMS microphone of claim 2, wherein the bent portion is bent toward the back-plate electrode layer by applying a preset bending voltage between the back-plate electrode layer and the vibration membrane.

6. The MEMS microphone of claim 5, wherein:

a back-plate electrode pad is disposed in the back-plate electrode layer and a vibration membrane electrode pad is disposed in the vibration membrane, in order to detect the capacitance between the back-plate electrode layer and the vibration membrane; and the bent portion is bent toward the back-plate by applying the preset bending voltage between the back-plate electrode pad and the vibration membrane electrode pad.

7. The MEMS microphone of claim 6, wherein a first metal layer is disposed on the back-plate electrode pad as an electrode terminal, and a second metal layer is disposed on the vibration membrane electrode pad as an electrode terminal.

* * * * *